(12) United States Patent
Greene et al.

(10) Patent No.: US 10,381,458 B2
(45) Date of Patent: Aug. 13, 2019

(54) SEMICONDUCTOR DEVICE REPLACEMENT METAL GATE WITH GATE CUT LAST IN RMG

(71) Applicant: International Business Machines Corporation, Armonk, NY (US)

(72) Inventors: Andrew M. Greene, Albany, NY (US); Balasubramanian P. Haran, Albany, NY (US); Injo Ok, Loudonville, NY (US); Charan V. Surisetty, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 464 days.

(21) Appl. No.: 14/951,593

(22) Filed: Nov. 25, 2015

(65) Prior Publication Data
US 2017/0084723 A1 Mar. 23, 2017

Related U.S. Application Data

(63) Continuation of application No. 14/858,628, filed on Sep. 18, 2015, now Pat. No. 10,177,240.

(51) Int. Cl.
*H01L 29/66* (2006.01)
*H01L 29/78* (2006.01)
(Continued)

(52) U.S. Cl.
CPC .. *H01L 29/66545* (2013.01); *H01L 21/28079* (2013.01); *H01L 21/3213* (2013.01);
(Continued)

(58) Field of Classification Search
CPC ........... H01L 29/0649; H01L 29/42376; H01L 29/4238; H01L 29/66795; H01L 29/7855;
(Continued)

(56) References Cited

U.S. PATENT DOCUMENTS 9,331,074 B1* 5/2016 Chang ................. H01L 27/0886
2008/0290448 A1* 11/2008 Tilke ................. H01L 21/76229
257/513

(Continued)

OTHER PUBLICATIONS

Andrew M. Greene, et al., "Semiconductor Device Replacement Metal Gate With Gate Cut Last in RMG", U.S. Appl. No. 14/858,628, filed Sep. 18, 2015.
(Continued)

*Primary Examiner* — Marcos D. Pizarro
(74) *Attorney, Agent, or Firm* — Cantor Colburn LLP; Vazken Alexanian

(57) ABSTRACT

A technique relates to forming a semiconductor device. A starting semiconductor device having a fin structure patterned in a substrate, and a gate formed over the fin structure, the gate having a mid-region and an end-region is first provided. A trench is then patterned over the mid-region of the gate and a trench is patterned over the end-region of the gate. The patterned trenches are then etched over the mid-region of the gate and the end-region of the gate to form the trenches. A conformal low-k dielectric layer can then be deposited over the structure to fill the trenches and pinch off the trench formed in the mid-region and the trench formed in the end-region.

11 Claims, 14 Drawing Sheets

(51) Int. Cl.
*H01L 29/06* (2006.01)
*H01L 29/423* (2006.01)
*H01L 27/088* (2006.01)
*H01L 21/8234* (2006.01)
*H01L 21/28* (2006.01)
*H01L 21/3213* (2006.01)
*H01L 21/8238* (2006.01)
*H01L 27/092* (2006.01)

(52) U.S. Cl.
CPC ............... *H01L 21/823431* (2013.01); *H01L 21/823821* (2013.01); *H01L 27/0886* (2013.01); *H01L 27/0924* (2013.01); *H01L 29/0649* (2013.01); *H01L 29/4238* (2013.01); *H01L 29/42376* (2013.01); *H01L 29/66795* (2013.01); *H01L 29/785* (2013.01); *H01L 29/7855* (2013.01); *H01L 29/7856* (2013.01); *H01L 21/82345* (2013.01); *H01L 21/823828* (2013.01); *H01L 2029/7858* (2013.01)

(58) Field of Classification Search
CPC ......... H01L 2029/7858; H01L 27/0886; H01L 21/823431; H01L 21/82345
See application file for complete search history.

(56) References Cited

U.S. PATENT DOCUMENTS

2015/0118839 A1* 4/2015 Bruce ................. H01L 21/0206
438/595
2016/0379870 A1* 12/2016 Clark ................ H01L 21/76814
438/694

OTHER PUBLICATIONS

List of IBM Patents or Patent Applications Treated as Related; (Appendix P), Filed Feb. 2, 2016; 2 pages.

* cited by examiner

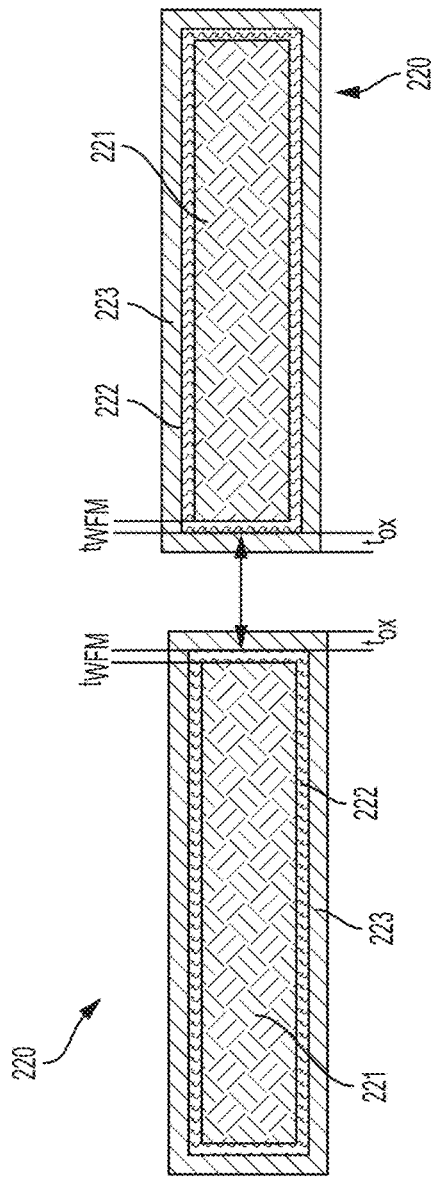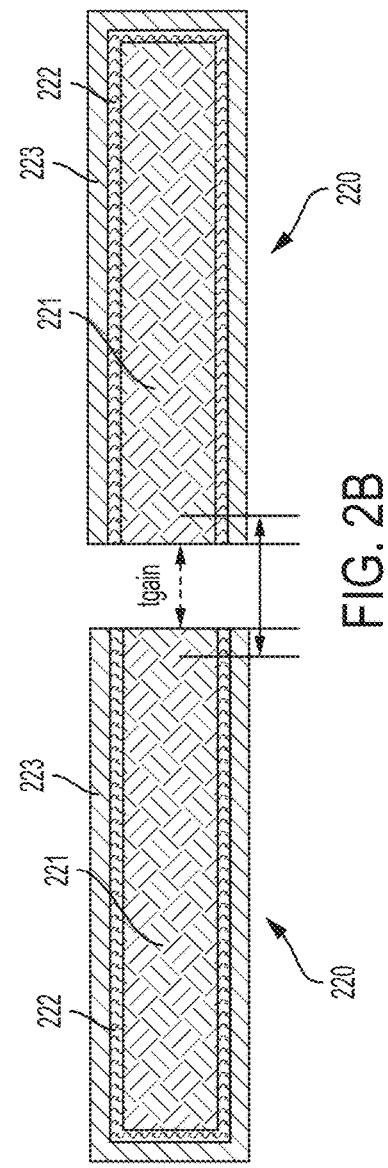
FIG. 2A
FIG. 2B

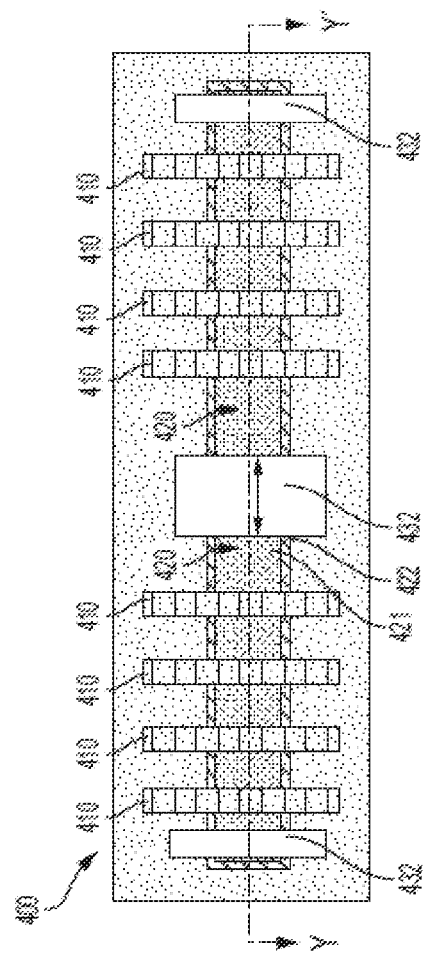
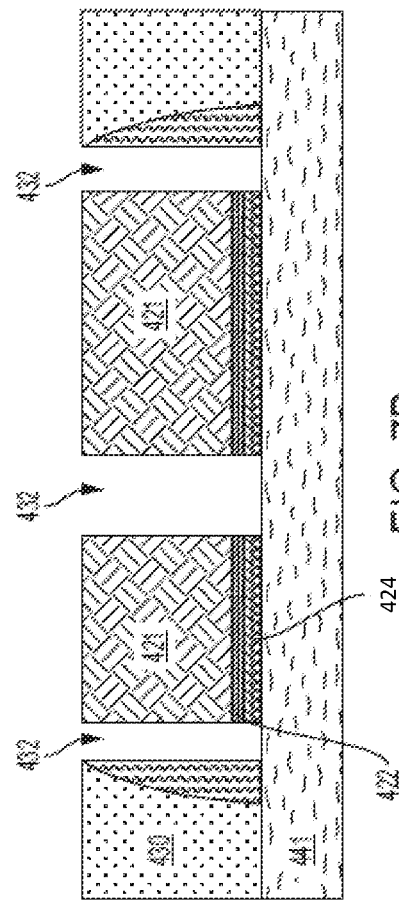
FIG. 7A
FIG. 7B

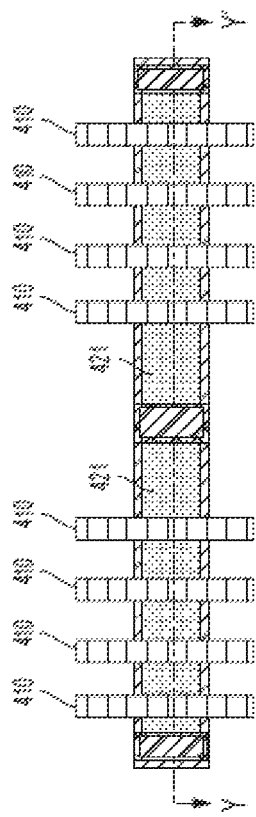
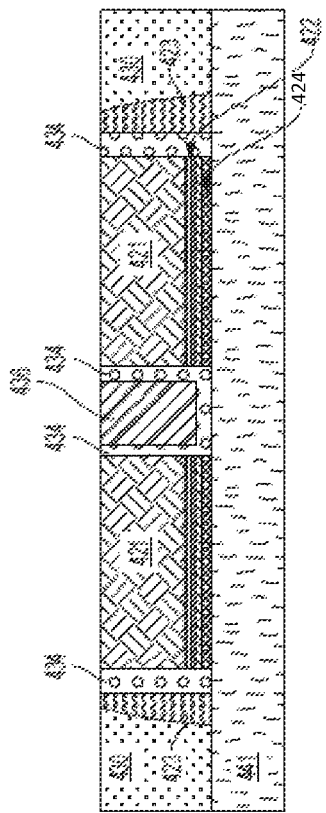
FIG. 10A
FIG. 10B

SEMICONDUCTOR DEVICE REPLACEMENT METAL GATE WITH GATE CUT LAST IN RMG

PRIORITY

This application is a Continuation of U.S. patent application Ser. No. 14/858,628, filed Sep. 18, 2015, and all the benefits accruing therefrom under 35 U.S.C. § 119, the contents of which in its entirety are herein incorporated by reference.

BACKGROUND

The present invention generally relates to metal-oxide-semiconductor field-effect transistors (MOSFET), and more specifically, to MOSFET interconnect technology.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the majority current carriers and is built directly in a p substrate with n-doped source and drain junctions. The PFET uses holes as the majority current carriers and is built in an n-well with p-doped source and drain junctions.

The fin-type field effect transistor (FinFET) is a type of MOSFET. The FinFET contains a conformal gate around the fin that mitigates the effects of short channels and reduces drain-induced barrier lowering. The "fin" refers to the narrow channel between source and drain regions. A thin insulating high-k gate oxide layer around the fin separates the fin channel from the gate metal.

SUMMARY

According to an embodiment of the present invention, a method for making a semiconductor structure is provided. The method includes providing a starting semiconductor device having a fin structure patterned in a substrate, and a gate formed over the fin structure, the gate having a mid-region and an end-region. The method further includes patterning a trench over the mid-region of the gate and a trench over the end-region of the gate and etching the trench patterned over the mid-region of the gate and the trench patterned over the end-region of the gate to form the trenches. Additionally, the method includes depositing a conformal low-k dielectric layer over the structure to fill the trenches and pinch off the trench formed in the mid-region and the trench formed in the end-region.

According to one embodiment, a method for making a self-aligned interconnect structure is provided. The method includes patterning a fin structure in a substrate and forming a gate over the fin structure, the gate having a mid-region and an end-region. The method further includes patterning a trench over the mid-region of the gate and the end-region of the gate, etching the trench patterned over the mid-region of the gate and the end-region of the gate to form the trenches, and depositing a conformal low-k dielectric layer over the structure to fill the trenches and pinch off the trench formed in the mid-region and the trench formed in the end-region.

According to one embodiment, a self-aligned interconnect structure is provided. The structure can include a fin structure patterned in a substrate and a gate disposed over the fin. In some aspects, the metal gate has a trench formed in a mid-region of the gate and a trench formed in an end-region of the gate, wherein the trench formed in the mid-region of the gate and the trench formed in the end-region of the gate are free of metal residue.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2A is a top down view of a PC with a trench cut first;

FIG. 2B is a top down view of a PC formed prior to etching or cutting the trench;

FIG. 7A is a top down view of a semiconductor having trenches formed therein with the photoresist removed;

FIG. 7B is a cross-sectional view of the semiconductor along line YY' of FIG. 7A;

FIG. 10A is a top down view of a semiconductor having the gate metal exposed;

FIG. 10B is a cross-sectional view of the semiconductor along line YY' of FIG. 10A.

DETAILED DESCRIPTION

Figure 1B:
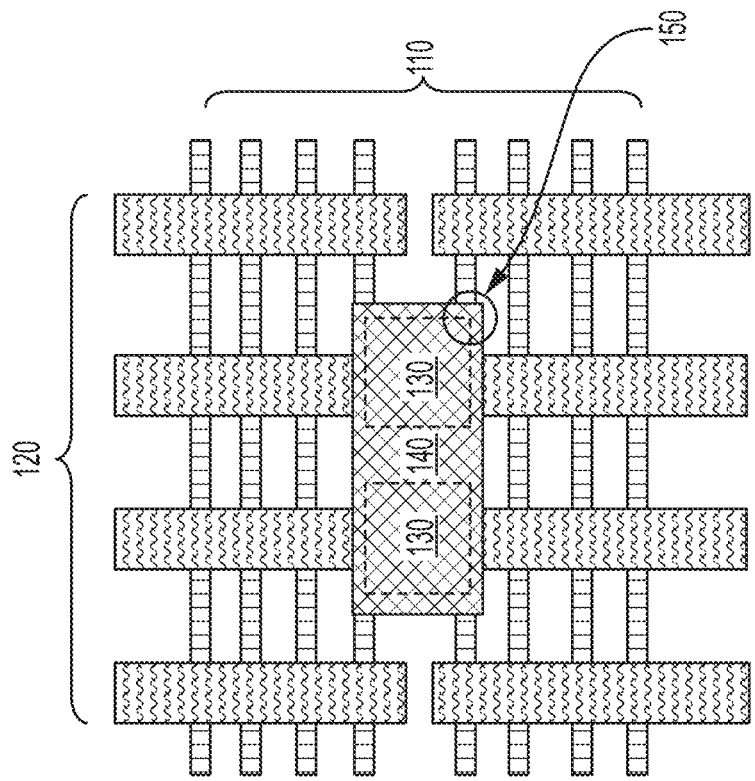
FIG. 1B is a top down view of a conventional gate-to-gate contact.

As stated above, the present invention relates to MOSFETs, and particularly to interconnect technology, which are now described in detail with accompanying figures. It is noted that like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Metal residue along the edges of gate stacks can result in gate to contact shorting, particularly as devices are scaled down to the 7 nanometer (nm) foot-print. Additionally, epitaxial shorting can occur around the end line of PC gate stacks and spacer etching and pulldown can result from traditional contact formation which ultimately can yield epitaxial nodules and other unwanted issues in semiconductor formation.

Figure 1A:
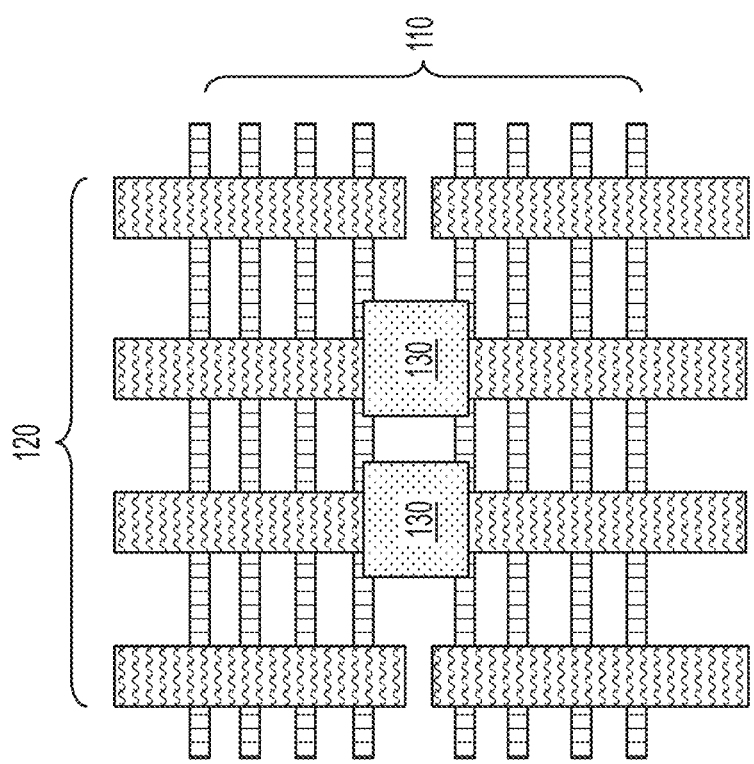
FIG. 1A is a top down view of a conventional gate-to-gate contact.

FIGS. 1A and 1B illustrate a conventional MOSFET gate interconnect. As shown in FIG. 1A, gates 120 are disposed over fins 110. The gates 120 can be formed over the fins 110 patterned from a substrate. Epitaxial contacts (not shown) forming source and drain regions on opposing sides of the gates are positioned over the fins 110. Narrow metal contacts 130 (also known as "CB-to-PC" or simply "CB") are formed on the top of the metal gates 120 (see FIG. 1A). As used herein, PC means shorter (<40 nanometer) gate Photolithography layer, CB means longer (>40 nanometer) gate Photolithography layer, CT means PC cut Photolithography layer, CA and CC mean source/drain open Photolithography layer.

Figure 1D:
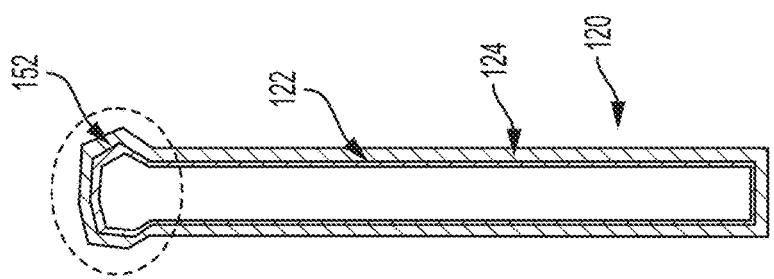
FIG. 1D is a schematic drawing of an example gate structure having metal residue that causes shorting.
Figure 1C:
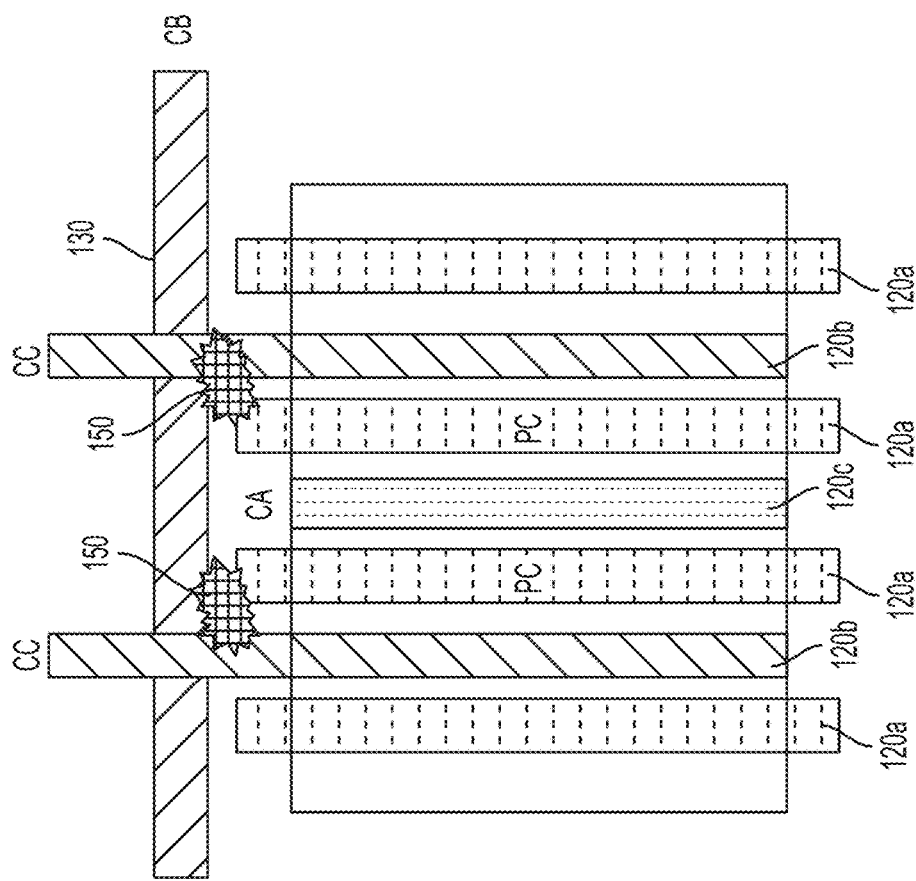
FIG. 1C is a top down view of a semiconductor structure having shorting in regions around gate stacks.

In some aspects, another metal layer (see FIG. 1B) is then formed over the narrow metal CB contacts 130 in order to electrically connect the adjacent gates to form the gate interconnect 140. As shown in FIGS. 1B and 1C, shorting can occur in the region 150 shown between gate stacks and/or fins. For example as shown in FIG. 1C, shorting can occur in the region 150 between the PC stack 120a, CC stack 120b, CA stack 120c, and any other contacts such as the CB contact 130. Shorting in the region 150 between the gate interconnect 140 and adjacent fins 110 can also occur due to the short distance between the interconnect 140 and the fins 110 and because the gate interconnect 140 is not in the same parallel plane as the gates 120. CB pattern overlay and alignment to the PC below can also miss the desired PC connection and short to adjacent PCs. As MOSFET scaling continues, interconnect pattern density and overlap alignment may be increasingly problematic.

Figure 1E:
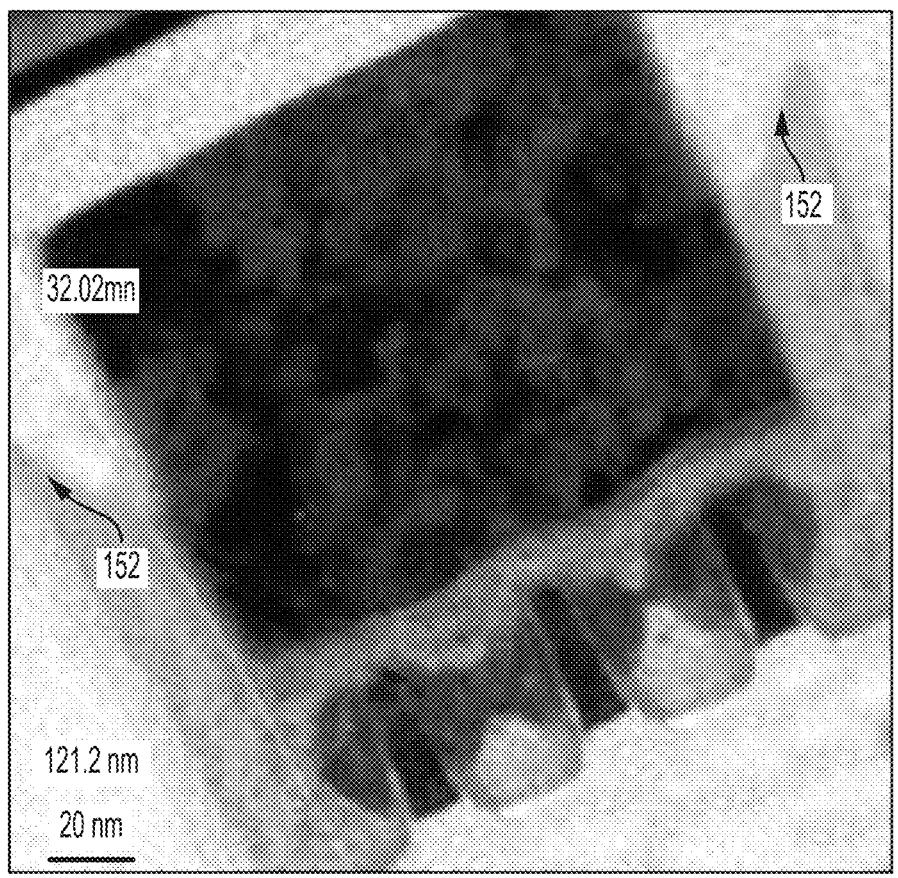
FIG. 1E is a scanning-electron microscope image of a center of a MOSFET having shorting metal residue.

In some aspects, shorting is caused by metal residue 152 that is formed on the gate stacks due to the gate stack formation process. For example, as shown in FIG. 1D, the gate stack 120 can be formed of, among other things, a work function metal 122 and a high-k metal 124, both of which cause metal residue to build up around the edges of the gate stack 120. FIG. 1E is a scanning-electron microscope image of a center of a MOSFET as described above having shorting metal residue 152. In some aspects, it is understood that this metal residue 152 can be caused by epitaxial nodule growth, for example.

As such, a trench can be etched and formed last, i.e., following formation of the gate stacks. That is, the PC can be cut or etched following replacement metal gate (RMG) formation. In some embodiments, this "CT cut last" process provides for maximization of scaling potential for PC to PC separation in SRAM. Additionally, the CT cut last process provides for a means to resolve gate end shorting due to work function metal (WFM) residues and allows for additional scaling of tip to tip PC separation. Moreover, the CT cut last process can allow for additional tolerance of CA/CB alignment while still keeping the same CT separation and can provide a solution for deep SRAM scaling.

FIG. 2A is a top down view of a PC with a contact trench cut first, i.e., the gate is filled with high-k, WFM, and a gate metal, such as tungsten, after cutting or etching the contact channel. FIG. 2B is a top down view of a PC formed prior to etching or cutting the contact channel, i.e., FIG. 2B is a top down view of a semiconductor formed with an example CT cut last process. As shown in FIGS. 2A-2B, the CT cut last process can account for a gain in contact thickness. Specifically, the CT cut last process can account for a gain of twice the thickness of the oxide layer tox, and twice the work function metal layer thickness twfm. These gains can be achieved by cutting the PC after deposition and formation of the gate stack 220 layers such as oxide 223, WFM 222, and gate metal 221. Specifically as shown in FIGS. 2A-2B, the gained thickness tgain is equal to two times the oxide thickness (2*tox) plus two times the thickness of the work function metal (2*twfm).

Figure 2C:
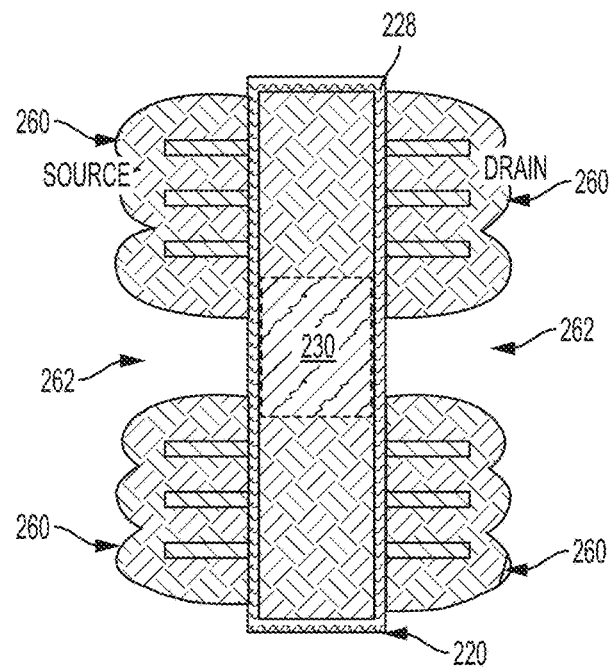
FIG. 2C is a top down view of example gate stack formed over fins with a CT formed with a CT cut last process.

FIG. 2C is a top down view of example gate stack 220 formed over fins 210 with a contact (CT) 230 formed with a CT cut last process. As shown active regions 260 are formed on opposing sides of the gate stack 220 and contact 230. As shown, the CT cut last process can prevent epitaxial (EPI) shorting around the PC end line. This results from having the spacer 228 of the gate stack 220 remain in place through epitaxial growth (as a result of not cutting or etching the contact channel prior to replacement gate metal formation). As such, a region 262 with no epitaxial merge thus preventing source/drain (S/D) epitaxial merge and any resulting shorting.

Figure 2D:
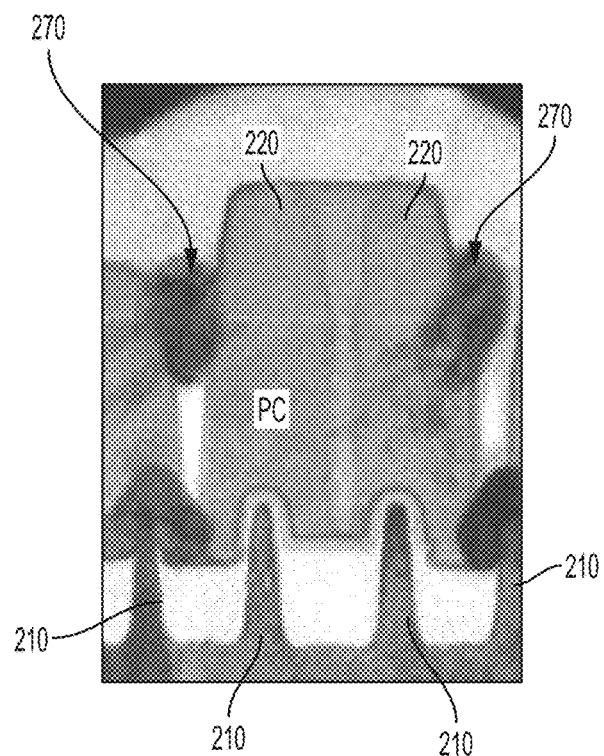
FIG. 2D is a scanning-electron microscope image of an example gate stack showing epitaxial nodule growth.
Figure 2E:
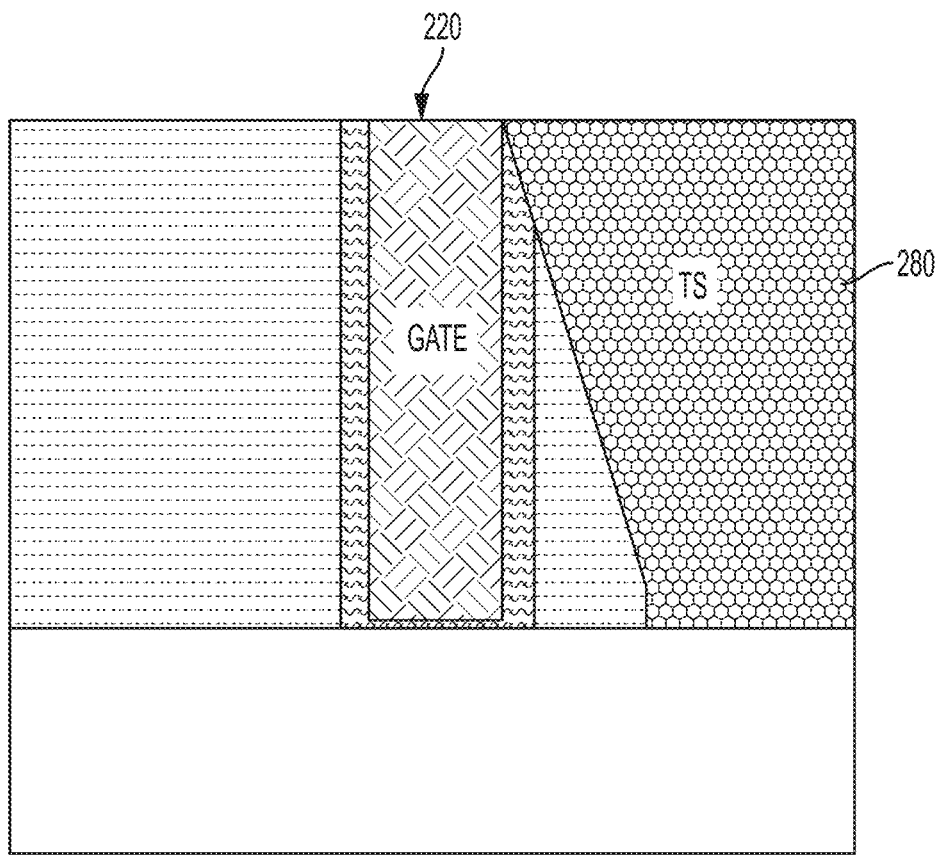
FIG. 2E is a cross sectional view of an example gate stack.

FIG. 2D is a scanning-electron microscope image of an example gate stack showing epitaxial nodule growth. As shown, the CT cut last process can minimize spacer etching and/or pulldown during the CT etching, such as reactive ion etch (RIE) as will be discussed in more detail below. Specifically, typically, the corners of the PC are susceptible to damage and erosion and can lead to epitaxial nodule 270 growth. FIG. 2E is a cross section view of an example gate stack. The methods described herein can further prevent shorting between PC gates 220 and contacts to source and drawing regions such as CA and/or TS contacts 280, due to a more robust spacer downstream in the contact formation module during contact etching.

Figure 3:
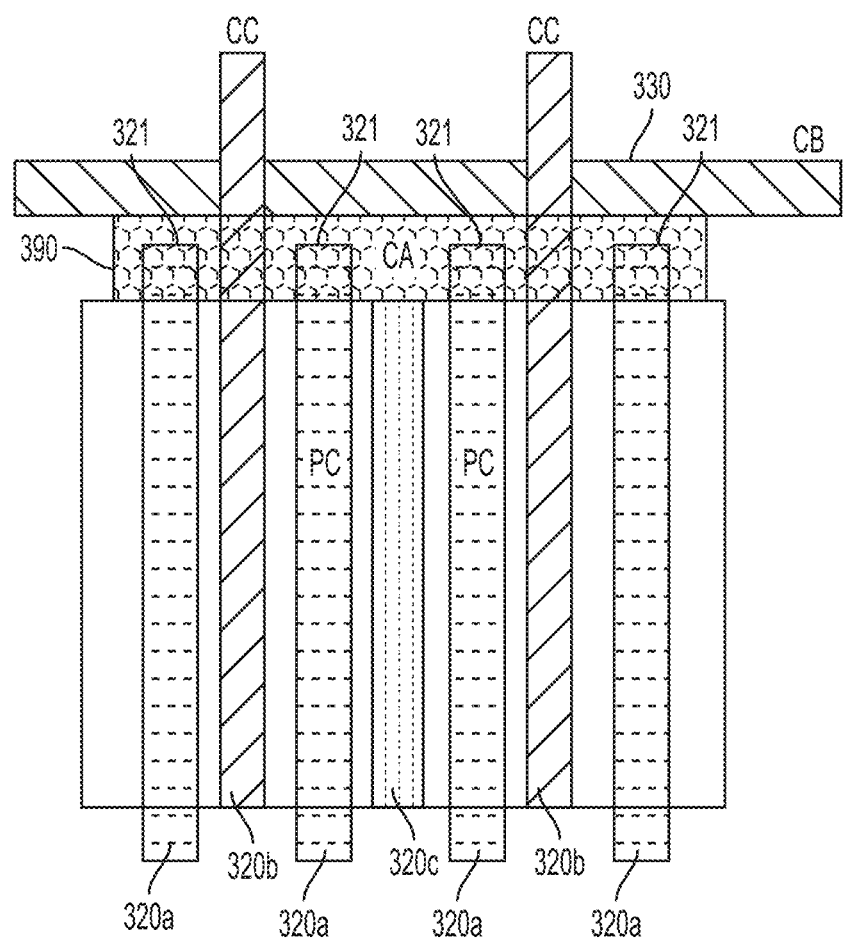
FIG. 3 a top down view of a semiconductor structure having shorting in regions around gate stacks and a gate (PC and CT) mask disposed thereon.

As described above and as shown in FIGS. 1C-1D, work function metal residues can cause shorting between the PC end and the contact. FIG. 3 a top down view of a semiconductor structure having shorting in regions around gate stacks and a gate and contact (PC and CT) mask disposed thereon. Thus, as shown in FIG. 3, a gate and contact (PC and CT) mask 390 which overlaps the end PC lines 321 can prevent this issue. Moreover, when using a mask 390, either a mid PC CT and/or an end PC CT can be utilized on the same mask and the mask 390 functions to separate the gates and devices by cutting the gates during replacement metal gate formation.

Figure 4A:
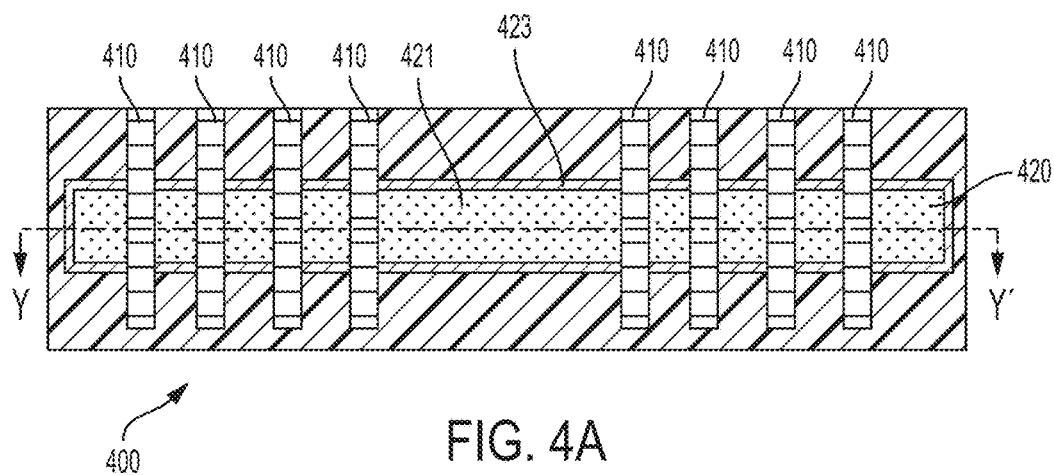
FIG. 4A is a top down view of an example starting gate and fin structure.
Figure 4B:
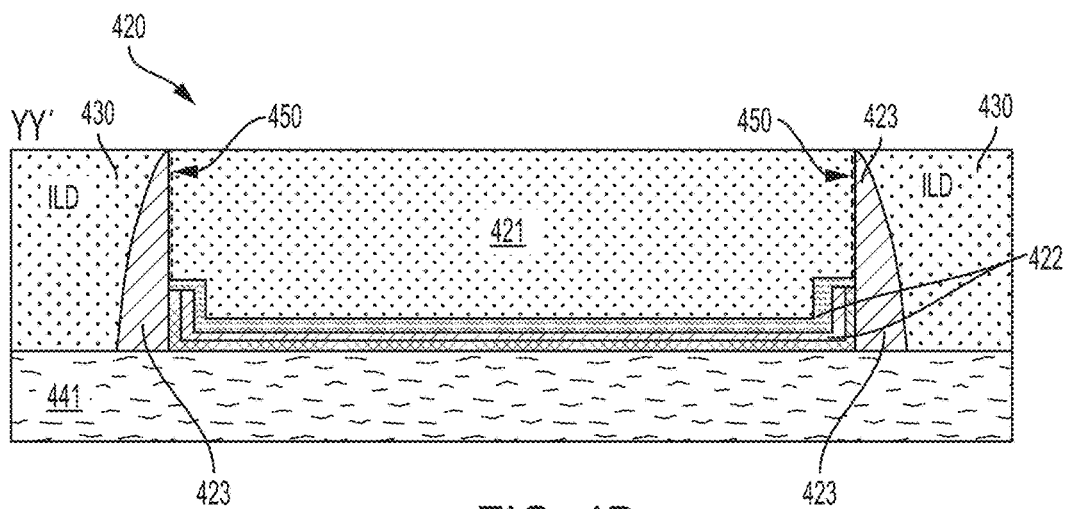
FIG. 4B is a cross sectional view along line YY' shown in FIG. 4A.

As described above, etching the CT after replacement metal gate formation ("CT cut last") can be achieved as described below. FIGS. 4A-4B illustrate a starting semiconductor 400 having a gate and fin structure on a substrate in an embodiment for etching the CT after replacement metal gate. FIG. 4A is a top down view of an example starting gate and fin structure. FIG. 4B is a cross sectional view along line YY' shown in FIG. 4A. As shown, fins 410 are patterned and etched onto a substrate 441 and gates are then formed thereon as will be discussed below. At this starting point, the gates 420 are not etched for a contact but rather extend across the fins 410 as shown in FIG. 4A. Furthermore as will be discussed, the gate 420 includes a high-k layer 424, work function metal (WFM) stack 422, gate metal 421, and spacers 423. The device can also include an inter-layer dielectric (ILD) 430.

Figure 5B:
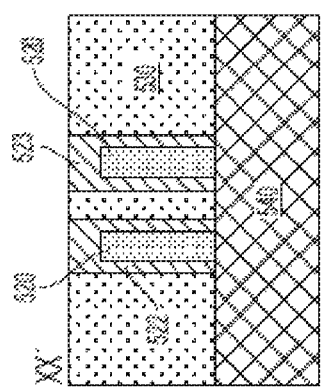
FIG. 5B is a cross-sectional side view through the XX' plane of FIG. 5A.
Figure 5D:
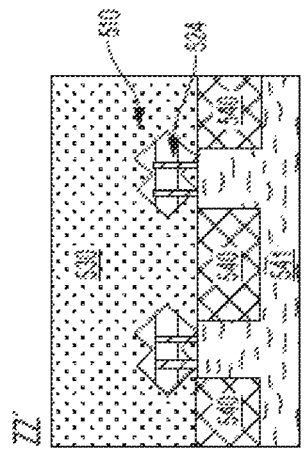
FIG. 5D is a cross-sectional side view through the ZZ' plane of FIG. 5A.
Figure 5A:
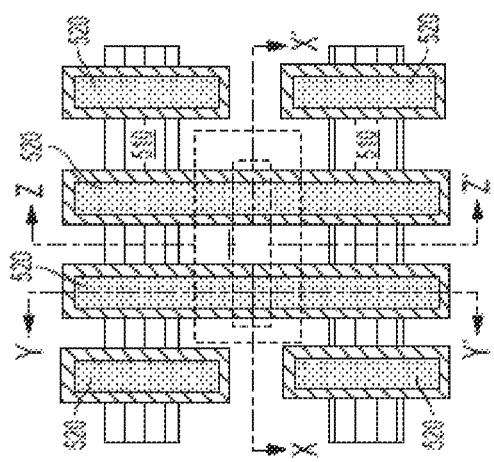
FIG. 5A is a top down view of an example starting structure shown in FIGS. 4A-4B.
Figure 5C:
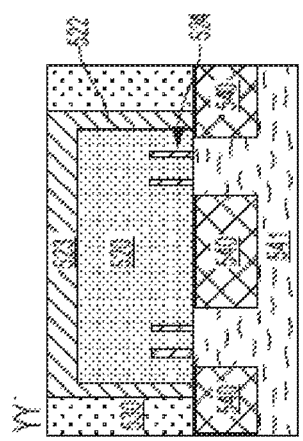
FIG. 5C is a cross-sectional side view through the YY' plane of FIG. 5A.

FIGS. 5A-5D further illustrate the example starting structure shown in FIGS. 4A-4B. FIGS. 5B, 5C, and 5D are cross-sectional side view through the XX', YY', and ZZ' planes of FIG. 5A. Note that, for simplicity, FIG. 5A does not show the ILD layer 530 or the hard mask layer 523 shown in FIGS. 5B, 5C, and 5D.

Initially, fins 524 are patterned and etched into an underlying substrate 541 and separated by shallow trench isolation (STI) regions 540. The fins 524 may be formed from a substrate 541 made of, for example, silicon, silicon germanium, or other suitable semiconductor material. A sacrificial insulator layer (not shown) surrounds the fins 524. A STI etching and dielectric fill process is performed to form the STI regions 540 between sets of fins. The STI regions 540 are isolation regions formed by etching trenches in the substrate 541 and then filling the trenches with, for example, silicon oxide. Alternatively, the trenches may be lined with a silicon oxide liner formed by a thermal oxidation process and then filled with additional silicon oxide or another material.

Replacement gates 520 ("dummy gates") are formed over the fins 524. The replacement gates 520 are filled with a suitable replacement material, for example, amorphous silicon (polysilicon). An insulating hard mask layer 523 for example, silicon nitride (SiN), SiOCN, or SiBCN is deposited on the replacement gate silicon to form a PC hard mask. The replacement gate 520 is then patterned and etched into the silicon and hard mask layer 523 to form high aspect-ratio replacement gates over the substrate 541. An insulating liner material, for example, silicon nitride (SiN), SiOCN, or SiBCN, is deposited over the replacement gates 520, and then a reactive ion etch (RIE) process is performed to form spacers 522 surrounding the replacement gates 520.

To form the n-type (or p-type) epitaxial contacts 510 around the fins 524, an organic patterning stack (not shown) is applied over the p-type gate (or n-type gate) replacement gate 520 and patterned. A directional RIE process is performed to remove the spacer material to expose the underlying fins 524. An epitaxial growth process over the fins 524 forms the source and drain regions. Suitable materials for the epitaxial contacts 510 depend on the type of MOSFET (n-type or p-type). Non-limiting examples of suitable materials include silicon or silicon-germanium containing p-type dopants (e.g., boron), n-type dopants (e.g., phosphorus), or any combination thereof. A low-k dielectric oxide forming the ILD layer 530 is then disposed over the epitaxial contacts 510 to form the structures shown in FIGS. 5B, 5C, and 5D. The ILD layer 530 may be formed from, for example, a low-k dielectric oxide, including but not limited to, spin-on-glass, a flowable oxide, a high density plasma oxide, or any combination thereof. Further, to arrive at the starting gate structure 420 shown in FIGS. 4A-4B, the gate structures shown in FIGS. 5A-5D can be planarized, for example using chemical mechanical planarization (CMP), selective to the gate metal 421.

Figure 6A:
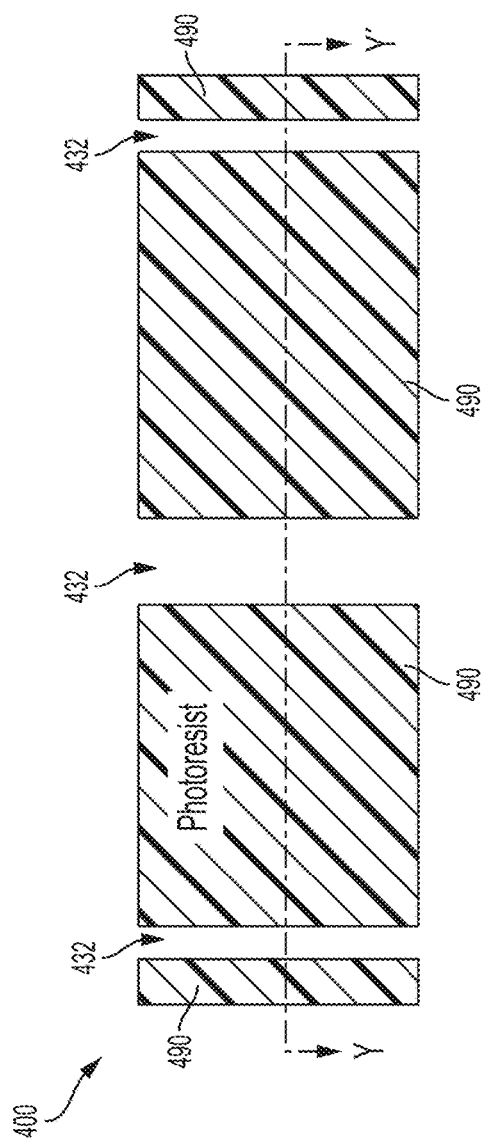
FIG. 6A is a top down view of a starting semiconductor having trenches formed therein.
Figure 6B:
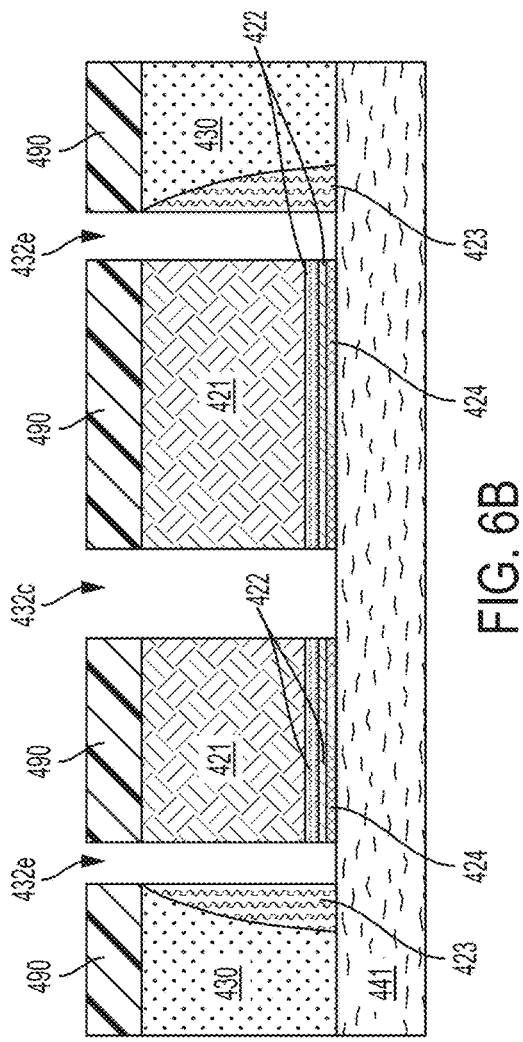
FIG. 6B is a cross-sectional view of the semiconductor along line YY' of FIG. 6A.

FIG. 6A is a top down view of the starting semiconductor 400 having trenches formed therein. FIG. 6B is a cross-sectional view of the semiconductor 400 along line YY' of FIG. 6A. As shown, the starting structure 400 can be prepared for contact (CT) formation by first applying a photoresist mask 490. By selectively applying the photoresist 490 to leave desired trenches 432 unmasked, the gate metal 421, work function metal stack 422, and high-k 424 layers can be removed using an etch process in the trenches 432. That is, the photoresist 490 is patterned on the structure 400 using lithography to form a desired pattern. Any suitable photoresist can be used, such as for example OPL and ARC resists. By developing the resist 490, an anisotropic etch— for example—can be used to etch the gate stack from the trenches 432. This resist 490 patterning can etch the trenches 432 to separate active gates and also etch the edge regions to remove the WFM metal residue 450 from the gate ends. That is, the resist 490 can be patterned such that a contact trench 432c is formed in a mid-region of the gate stack 420 formed on semiconductor 400 and such that contact trenches 432e is formed on an end-region of the gate stack 420 formed on semiconductor 400.

Next, the photoresist 490 can be removed. FIG. 7A is a top down view of the semiconductor 400 having trenches formed therein with the photoresist 490 removed. FIG. 7B is a cross-sectional view of the semiconductor 400 along line YY' of FIG. 7A. Any suitable process can be used to remove the photoresist. It is appreciated, however, that in at least some aspects the removal should not laterally etch the high-k layer, work function metal, or gate metals as such lateral etching can increase the PC (T2T) dimension.

Figure 8A:
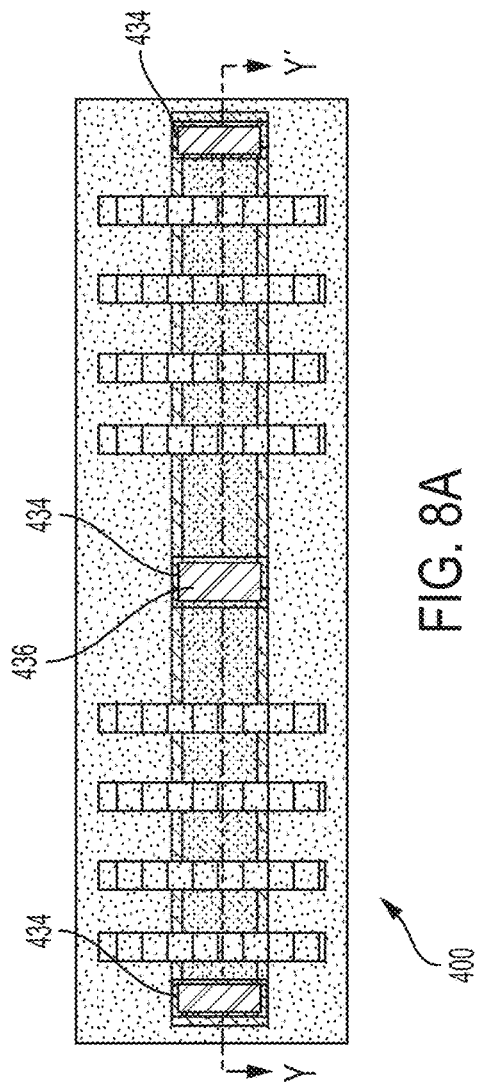
FIG. 8A is a top down view of a semiconductor having a conformal low-k dielectric layer and a flowable oxide layer deposited thereon.
Figure 8B:
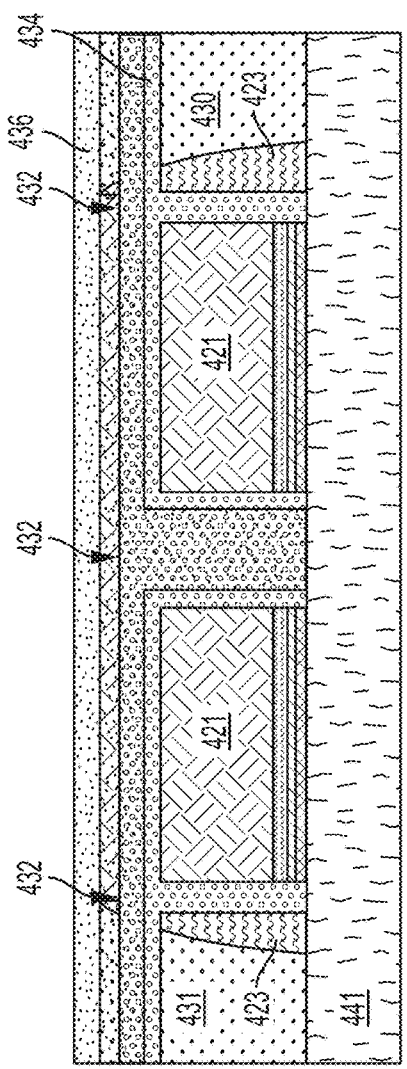
FIG. 8B is a cross-sectional view of the semiconductor along line YY' of FIG. 8A.

After forming the trenches 432 and removing the photoresist 490, iRAD SiN and flowable oxide layers may be deposited. FIG. 8A illustrates the semiconductor 400 having a conformal low-k dielectric layer 434 and a flowable oxide layer 436 deposited thereon. FIG. 8B is a cross-sectional view of the semiconductor 400 along line YY' of FIG. 8A. As shown, a conformal low-k dielectric layer 434 can be deposited such that it fills the etched trenches 432. Any suitable method of depositing the low-k dielectric layer 434 can be used and any suitable low-k dielectric material may be used. For example, SiN can be used. The low-k dielectric can be deposited with a suitable thickness to pinch off both a mid-cut edge and/or an edge cut—such as the trenches cut to remove the metal residue 450. As used herein, to "pinch off" means to squeeze in gate by filling metal or some connection between gate by over-filling or due to narrow gate or line end roughness. For example, the conformal low-k dielectric layer 434 can be between 3 nanometers (nm) and 100 nanometers (nm) thick. In other aspects, the conformal low-k dielectric layer 434 can be between 3 nanometers (nm) and 50 nanometers (nm) thick.

An additional inter-layer dielectric layer 436 can be deposited above the low-k dielectric 434 in order to ensure that any etched trenches 432 are sufficiently pinched off. Any suitable dielectric material can be used. In some aspects, the inter-layer dielectric layer is a flowable oxide layer. Generally, long channel gates and cut regions may need the additional inter-layer dielectric layer 436 to pinch the etched trenches.

Figure 9A:
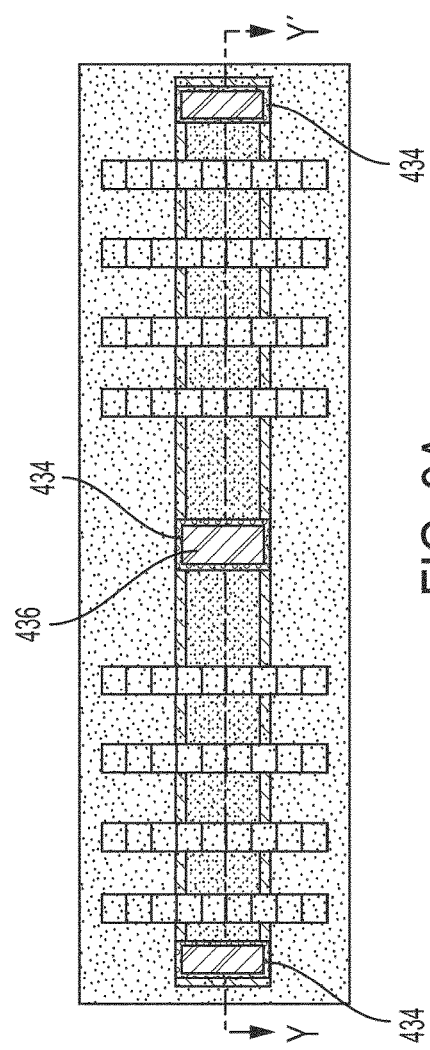
FIG. 9A is a top down view of a semiconductor following planarization selective to the conformal low-k dielectric layer.
Figure 9B:
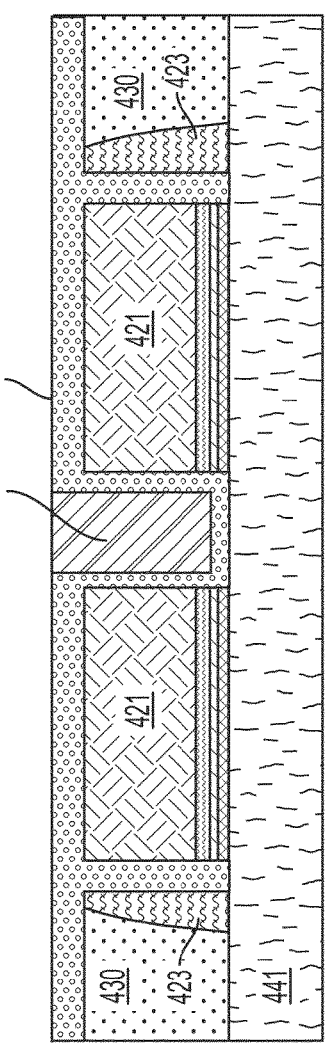
FIG. 9B is a cross-sectional view of the semiconductor along line YY' of FIG. 9A.

Following low-k dielectric deposition, a chemical mechanical planarization process selective to the conformal low-k dielectric layer 434 can be used. FIG. 9A is a top down view of the semiconductor 400 following planarization selective to the conformal low-k dielectric layer 434. FIG. 9B is a cross-sectional view of the semiconductor 400 along line YY' of FIG. 9A. In some aspects, the CMP slurry may be selective to the low-k material.

Finally, the metal gate can be exposed. FIG. 10A is a top down view of the semiconductor 400 having the gate metal exposed according to an embodiment. FIG. 10B is a cross-sectional view of the semiconductor 400 along line YY' of FIG. 10A. As shown, the remaining low-k dielectric layer 434 can be selectively removed to expose the gate metal 421. This can be accomplished using any suitable methods, such as CMP, gas cluster ion beam (GCIB) removal, non-selective RIE. In at least some aspects, GCIB can be used to improve global non-uniformity. The low-k dielectric removal can be selective so as to not remove the gate metal. For example, the removal method can be one that removes SiN and SiO2, but is selective to tungsten.

As such, the resulting semiconductor 400 has no metal residue on the gate sidewalls and has additional SiN liner fill 434, 436 between the gate metal 421 and the sidewall spacer 423. As such, shorting due to the metal residue 450 is effectively reduced or even eliminated.

Any suitable materials performing the above described functions can be used in accordance with the teachings herein. For example, as described herein a variety of patterning layers can be used. Non-limiting examples of suitable materials for the sacrificial patterning layers can include aluminum oxide (AlO$_3$), hafnium oxide (HfO$_2$), titanium nitride (TiN), or amorphous silicon. These patterning layers can be deposited by any suitable method depending on the type of material and can be, for example, plasma-enhanced chemical vapor deposition (PECVD) or atomic layer deposition (ALD). Non-limiting examples of suitable high-k oxides include hafnium dioxide, aluminum oxide, zirconium dioxide, hafnium silicate, zirconium silicate or any combination thereof. Non-limiting examples of suitable work function metals include aluminum, titanium, silver, copper, gold, or any combination thereof. Non-limiting examples of suitable gate metals include tungsten, tungsten titanium nitride, titanium, titanium nitride, tantalum, molybdenum, or any combination thereof.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

What is claimed is:

1. A method for making a semiconductor structure, the method comprising:
   providing a starting semiconductor device having a fin structure patterned in a substrate, and a gate formed over the fin structure, the gate having a mid-region and an end-region;
   patterning a first trench in a mask over the mid-region of the gate and a second trench in the mask over the end-region of the gate;
   etching, using the mask, a first trench in the mid-region of the gate and a second trench in the end-region of the gate, the first trench and the second trench being separate trenches formed in different regions of the gate, the first trench comprising a bottom wall formed of the substrate and a plurality of sidewalls formed of a gate metal and a work function metal stack, and the second trench comprising a bottom wall formed of the substrate, a first sidewall formed of a gate spacer, and a second sidewall formed of the gate metal and the work function metal stack; and depositing a conformal low-k dielectric layer over the structure to fill the first trench and the second trench, and pinch off the first trench formed in the mid-region and the second trench formed in the end-region.

2. The method of claim 1, wherein the gate is a replacement metal gate.

3. The method of claim 1, wherein the mask is a photoresist.

4. The method of claim 1, wherein etching the first trench and the second trench in the gate comprises etching with an anisotropic plasma etch.

5. The method of claim 1, further comprising depositing an inter-layer dioxide on the conformal low-k dielectric layer.

6. The method of claim 1, wherein the conformal low-k dielectric layer comprises silicon nitride.

7. The method of claim 1, wherein etching the first trench and the second trench comprises removing metal residue.

8. The method of claim 1, wherein the conformal low-k dielectric layer has a thickness of about 3 to about 100 nanometers.

9. The method of claim 1, further comprising planarizing the structure selectively to the gate metal.

10. The method of claim 9, wherein planarizing the structure selectively to the gate metal comprises planarizing with chemical mechanical planarization selective to the conformal low-k dielectric layer.

11. The method of claim 10, wherein planarizing the structure selectively to the gate metal further comprises removing any remaining conformal low-k dielectric layer disposed on top of the gate metal.

* * * * *